(12) United States Patent
Payne et al.

(10) Patent No.: US 7,000,064 B2
(45) Date of Patent: Feb. 14, 2006

(54) DATA HANDLING SYSTEM

(75) Inventors: Robert Edwin Payne, Edinburgh (GB); Peter John Smith, Midlothian (GB)

(73) Assignee: Lexar Media, Inc., Fremont, CA (US)

( * ) Notice: Subject to any disclaimer, the term of this patent is extended or adjusted under 35 U.S.C. 154(b) by 217 days.

(21) Appl. No.: 10/260,180

(22) Filed: Sep. 27, 2002

(65) Prior Publication Data

US 2003/0099140 A1 May 29, 2003

(30) Foreign Application Priority Data

Sep. 28, 2001 (GB) .......................................... 0123419

(51) Int. Cl.
*G06F 12/00* (2006.01)

(52) U.S. Cl. ...................... 711/103; 711/163; 711/217; 711/219; 713/168; 713/170; 380/28

(58) Field of Classification Search ................. 711/103, 711/163, 217, 219; 713/168, 170; 380/28
See application file for complete search history.

(56) References Cited

U.S. PATENT DOCUMENTS

| | | | |
|---|---|---|---|
| 4,099,069 A | 7/1978 | Cricchi et al. | |
| 4,130,900 A | 12/1978 | Watanabe | |
| 4,210,959 A | 7/1980 | Wozniak | .................... 364/200 |
| 4,309,627 A | 1/1982 | Tabata | |
| 4,319,079 A | 3/1982 | Best | |
| 4,355,376 A | 10/1982 | Gould | ........................ 365/230 |
| 4,398,248 A | 8/1983 | Hsia et al. | |
| 4,405,952 A | 9/1983 | Slakmon | ..................... 360/49 |
| 4,414,627 A | 11/1983 | Nakamura | |
| 4,450,559 A | 5/1984 | Bond et al. | .................... 371/10 |
| 4,456,971 A | 6/1984 | Fukuda et al. | ............. 364/900 |
| 4,468,730 A | 8/1984 | Dodd et al. | |

(Continued)

FOREIGN PATENT DOCUMENTS

| | | |
|---|---|---|
| AU | 0 557 723 | 1/1987 |
| EP | 0 220 718 A2 | 5/1987 |
| EP | 0 243 503 A1 | 11/1987 |
| EP | 0 392 895 A2 | 10/1990 |
| EP | 0 424 191 A2 | 4/1991 |

(Continued)

OTHER PUBLICATIONS

Mendel Rosenblum and John K Ousterhout, The Design and Implementation of a Log–Structured File System, article, 1991, 15 pgs., Berkeley, USA.
Brian Dipert and Markus Levy, Designing with Flash Memory, book, Apr. 1994, 445 pgs., Annabooks, San Diego, USA.
Science Forum, Inc., Flash Memory Symposium '95, symposium, 1995, 13 pgs.; Hongo, Bunkyo–ku, Tokyo.
Ross S. Finlayson and David R. Cheriton, An Extended File Service Exploiting White–Once Storage, article, 1987, 10 pgs. ACM.
Jason Gait, The Optical File Cabinet: A Random–Access File System for White–Once Optical Disks, article, Jun. 1988, 12 pgs., Beaverton, Oregon.
Henry G. Baker, Memory Management, book, 1995, 19 pgs., Springer–Verlag Berlin Heidelberg, Germany.

(Continued)

*Primary Examiner*—Mano Padmanabhan
*Assistant Examiner*—Mehdi Namazi
(74) *Attorney, Agent, or Firm*—Law Offices of Imam

(57) ABSTRACT

In one embodiment of the present invention, there is disclosed, a method of handling data which is being written to and stored in flash memory, wherein input data, comprising information data and overhead data, undergoes a reversible transformation before being written to flash memory whereupon each bit stored in flash memory, as flash data, is a function of both information data and header data.

7 Claims, 4 Drawing Sheets

U.S. PATENT DOCUMENTS

| | | | |
|---|---|---|---|
| 4,473,878 A | 9/1984 | Zolnowsky et al. | |
| 4,476,526 A | 10/1984 | Dodd | |
| 4,498,146 A | 2/1985 | Martinez | 364/900 |
| 4,525,839 A | 6/1985 | Nozawa et al. | 371/38 |
| 4,532,590 A | 7/1985 | Wallach et al. | |
| 4,609,833 A | 9/1986 | Guterman | |
| 4,616,311 A | 10/1986 | Sato | 364/200 |
| 4,654,847 A | 3/1987 | Dutton | 371/10 |
| 4,710,871 A | 12/1987 | Belknap et al. | 364/200 |
| 4,746,998 A | 5/1988 | Robinson et al. | 360/72.1 |
| 4,748,320 A | 5/1988 | Yorimoto et al. | 235/492 |
| 4,757,474 A | 7/1988 | Fukushi et al. | 365/189 |
| 4,774,700 A | 9/1988 | Satoh et al. | 369/54 |
| 4,780,855 A | 10/1988 | Iida et al. | |
| 4,788,665 A | 11/1988 | Fukuda et al. | |
| 4,797,543 A | 1/1989 | Watanabe | |
| 4,800,520 A | 1/1989 | Iijima | 364/900 |
| 4,829,169 A | 5/1989 | Watanabe | |
| 4,843,224 A | 6/1989 | Ohta et al. | |
| 4,896,262 A | 1/1990 | Wayama et al. | 364/200 |
| 4,914,529 A | 4/1990 | Bonke | 360/48 |
| 4,920,518 A | 4/1990 | Nakamura et al. | 365/228 |
| 4,924,331 A | 5/1990 | Robinson et al. | 360/72.1 |
| 4,943,745 A | 7/1990 | Watanabe et al. | |
| 4,953,122 A | 8/1990 | Williams | 364/900 |
| 4,970,642 A | 11/1990 | Yamamura | |
| 4,970,727 A | 11/1990 | Miyawaki et al. | |
| 5,070,474 A | 12/1991 | Tuma et al. | 395/500 |
| 5,093,785 A | 3/1992 | Iijima | |
| 5,168,465 A | 12/1992 | Harari | 257/320 |
| 5,198,380 A | 3/1993 | Harari | 437/43 |
| 5,200,959 A | 4/1993 | Gross et al. | 371/21.6 |
| 5,218,695 A | 6/1993 | Noveck et al. | |
| 5,220,518 A | 6/1993 | Haq | |
| 5,226,168 A | 7/1993 | Kobayashi et al. | 395/800 |
| 5,227,714 A | 7/1993 | Lou | |
| 5,253,351 A | 10/1993 | Yamamoto et al. | |
| 5,267,218 A | 11/1993 | Elbert | |
| 5,268,318 A | 12/1993 | Harari | 437/43 |
| 5,268,870 A | 12/1993 | Harari | 365/218 |
| 5,270,979 A | 12/1993 | Harari et al. | 365/218 |
| 5,293,560 A | 3/1994 | Harari | 365/185 |
| 5,297,148 A | 3/1994 | Harari et al. | 371/10.2 |
| 5,303,198 A | 4/1994 | Adachi et al. | |
| 5,305,276 A | 4/1994 | Uenoyama | |
| 5,305,278 A | 4/1994 | Inoue | |
| 5,315,541 A | 5/1994 | Harari et al. | 365/63 |
| 5,315,558 A | 5/1994 | Hag | |
| 5,329,491 A | 7/1994 | Brown et al. | |
| 5,337,275 A | 8/1994 | Garner | 365/189.01 |
| 5,341,330 A | 8/1994 | Wells et al. | |
| 5,341,339 A | 8/1994 | Wells | |
| 5,341,341 A | 8/1994 | Fukuzo | |
| 5,353,256 A | 10/1994 | Fandrich et al. | 365/230.03 |
| 5,357,475 A | 10/1994 | Hasbun et al. | 365/218 |
| 5,359,569 A | 10/1994 | Fujita et al. | |
| 5,365,127 A | 11/1994 | Manley et al. | |
| 5,369,615 A | 11/1994 | Harari et al. | 365/218 |
| 5,371,702 A | 12/1994 | Nakai et al. | |
| 5,381,539 A | 1/1995 | Yanai et al. | |
| 5,382,839 A | 1/1995 | Shinohara | |
| 5,384,743 A | 1/1995 | Rouy | |
| 5,388,083 A | 2/1995 | Assar et al. | |
| 5,396,468 A | 3/1995 | Harari et al. | 365/218 |
| 5,404,485 A | 4/1995 | Ban | |
| 5,406,527 A | 4/1995 | Honma | |
| 5,418,752 A | 5/1995 | Harari et al. | |
| 5,422,842 A | 6/1995 | Cernea et al. | 365/185 |
| 5,422,856 A | 6/1995 | Sasaki et al. | |
| 5,428,621 A | 6/1995 | Mehrotra et al. | 371/21.4 |
| 5,430,682 A | 7/1995 | Ishikawa et al. | |
| 5,430,859 A | 7/1995 | Norman et al. | 395/425 |
| 5,431,330 A | 7/1995 | Wieres | |
| 5,434,825 A | 7/1995 | Harari | 365/185 |
| 5,438,573 A | 8/1995 | Mangan et al. | 371/10.3 |
| 5,465,235 A | 11/1995 | Miyamoto | |
| 5,465,338 A | 11/1995 | Clay | |
| 5,471,478 A | 11/1995 | Mangan et al. | 371/10.3 |
| 5,473,765 A | 12/1995 | Gibbon et al. | |
| 5,479,638 A | 12/1995 | Assar et al. | |
| 5,485,595 A | 1/1996 | Assar et al. | 395/430 |
| 5,490,117 A | 2/1996 | Oda et al. | |
| 5,495,442 A | 2/1996 | Cernea et al. | 365/185.03 |
| 5,504,760 A | 4/1996 | Harari et al. | 371/40.1 |
| 5,508,971 A | 4/1996 | Cernea et al. | 365/185.23 |
| 5,513,138 A | 4/1996 | Manabe et al. | |
| 5,515,333 A | 5/1996 | Fujita et al. | |
| 5,519,847 A | 5/1996 | Fandrich et al. | |
| 5,523,980 A | 6/1996 | Sakui et al. | |
| 5,524,230 A | 6/1996 | Sakaue et al. | |
| 5,530,673 A | 6/1996 | Tobita et al. | |
| 5,530,828 A | 6/1996 | Kaki et al. | |
| 5,530,938 A | 6/1996 | Akasaka et al. | |
| 5,532,962 A | 7/1996 | Auclair et al. | 365/201 |
| 5,532,964 A | 7/1996 | Cernea et al. | 365/189.09 |
| 5,534,456 A | 7/1996 | Yuan et al. | 437/43 |
| 5,535,328 A | 7/1996 | Harari et al. | 395/182.05 |
| 5,541,551 A | 7/1996 | Brehner et al. | |
| 5,544,118 A | 8/1996 | Harari | 365/218 |
| 5,544,356 A | 8/1996 | Robinson et al. | |
| 5,552,698 A | 9/1996 | Tai et al. | |
| 5,554,553 A | 9/1996 | Harari | 437/43 |
| 5,563,825 A | 10/1996 | Cernea et al. | 365/185.18 |
| 5,566,314 A | 10/1996 | DeMarco et al. | 395/430 |
| 5,568,439 A | 10/1996 | Harari | 365/218 |
| 5,572,466 A | 11/1996 | Sukegawa | |
| 5,579,502 A | 11/1996 | Konishi et al. | |
| 5,581,723 A | 12/1996 | Hasbun et al. | |
| 5,583,812 A | 12/1996 | Harari | 365/185.33 |
| 5,592,415 A | 1/1997 | Kato et al. | |
| 5,592,420 A | 1/1997 | Cernea et al. | 365/185.18 |
| 5,598,370 A | 1/1997 | Niijima | |
| 5,602,987 A | 2/1997 | Harari et al. | |
| 5,603,001 A | 2/1997 | Sukegawa et al. | |
| 5,611,067 A | 3/1997 | Okamoto et al. | |
| 5,640,528 A | 6/1997 | Harney et al. | |
| 5,642,312 A | 6/1997 | Harari | 365/185.33 |
| 5,648,929 A | 7/1997 | Miyamoto | |
| 5,663,901 A | 9/1997 | Wallace et al. | 365/52 |
| 5,693,570 A | 12/1997 | Cernea et al. | 437/205 |
| 5,712,819 A | 1/1998 | Harari | 365/185.29 |
| 5,719,808 A | 2/1998 | Harari et al. | 365/185.33 |
| 5,723,990 A | 3/1998 | Roohparvar | |
| 5,734,567 A | 3/1998 | Griffiths et al. | |
| 5,745,418 A | 4/1998 | Ma et al. | |
| 5,754,567 A | 5/1998 | Norman | |
| 5,757,712 A | 5/1998 | Nagel et al. | |
| 5,758,100 A | 5/1998 | Odisho | |
| 5,761,117 A | 6/1998 | Uchino et al. | |
| 5,768,190 A | 6/1998 | Tanaka et al. | |
| 5,768,195 A | 6/1998 | Nakamura et al. | |
| 5,773,901 A | 6/1998 | Kantner | |
| 5,778,418 A | 7/1998 | Auclair et al. | 711/101 |
| 5,781,478 A | 7/1998 | Takeuchi et al. | |
| 5,787,445 A | 7/1998 | Daberko | |
| 5,787,484 A | 7/1998 | Norman | |
| RE35,881 E | 8/1998 | Barrett et al. | |
| 5,799,168 A | 8/1998 | Ban | |
| 5,802,551 A | 9/1998 | Komatsu et al. | |
| 5,809,515 A | 9/1998 | Kaki et al. | |
| 5,809,558 A | 9/1998 | Matthews et al. | |

| | | |
|---|---|---|
| 5,809,560 A | 9/1998 | Schneider |
| 5,818,781 A | 10/1998 | Estakhri et al. |
| 5,822,245 A | 10/1998 | Gupta et al. |
| 5,822,252 A | 10/1998 | Lee et al. |
| 5,822,781 A | 10/1998 | Wells et al. |
| 5,831,929 A | 11/1998 | Manning |
| 5,835,935 A | 11/1998 | Estakhri et al. |
| 5,845,313 A | 12/1998 | Estakhri et al. |
| 5,847,552 A | 12/1998 | Brown |
| 5,860,083 A | 1/1999 | Sukegawa |
| 5,860,124 A | 1/1999 | Matthews et al. |
| 5,862,099 A | 1/1999 | Gannage et al. |
| 5,890,192 A | 3/1999 | Lee et al. |
| 5,901,086 A | 5/1999 | Wang et al. |
| 5,907,856 A | 5/1999 | Estakhri et al. |
| 5,909,586 A | 6/1999 | Anderson |
| 5,920,884 A | 7/1999 | Jennings, III et al. |
| 5,928,370 A | 7/1999 | Asnaashari |
| 5,930,815 A | 7/1999 | Estakhri et al. |
| 5,933,368 A | 8/1999 | Ma et al. |
| 5,933,846 A | 8/1999 | Endo |
| 5,936,971 A | 8/1999 | Harari et al. |
| 5,937,425 A | 8/1999 | Ban |
| 5,953,737 A | 9/1999 | Estakhri et al. |
| 5,956,473 A | 9/1999 | Ma et al. |
| 5,959,926 A | 9/1999 | Jones et al. |
| 5,966,727 A | 10/1999 | Nishino |
| 5,986,933 A | 11/1999 | Takeuchi et al. |
| 5,987,563 A | 11/1999 | Itoh et al. |
| 5,987,573 A | 11/1999 | Hiraka |
| 5,991,849 A | 11/1999 | Yamada et al. |
| 6,011,322 A | 1/2000 | Stumfall et al. |
| 6,011,323 A | 1/2000 | Camp |
| 6,021,408 A | 2/2000 | Ledain et al. |
| 6,026,020 A | 2/2000 | Matsubara et al. |
| 6,026,027 A | 2/2000 | Terrell, II et al. |
| 6,034,897 A | 3/2000 | Estakhri et al. |
| 6,035,357 A | 3/2000 | Sakaki |
| 6,040,997 A | 3/2000 | Estakhri |
| 6,047,352 A | 4/2000 | Lakhani et al. |
| 6,055,184 A | 4/2000 | Acharya et al. |
| 6,055,188 A | 4/2000 | Takeuchi et al. |
| 6,061,449 A * | 5/2000 | Candelore et al. ............ 380/28 |
| 6,072,796 A | 6/2000 | Christensen et al. |
| 6,081,447 A | 6/2000 | Lofgren et al. |
| 6,081,878 A | 6/2000 | Estakhri et al. |
| 6,097,666 A | 8/2000 | Sakui et al. |
| 6,115,785 A | 9/2000 | Estakhri et al. |
| 6,122,195 A | 9/2000 | Estakhri et al. |
| 6,125,424 A | 9/2000 | Komatsu et al. |
| 6,125,435 A | 9/2000 | Estakhri et al. |
| 6,128,695 A | 10/2000 | Estakhri et al. |
| 6,134,145 A | 10/2000 | Wong |
| 6,134,151 A | 10/2000 | Estakhri et al. |
| 6,141,249 A | 10/2000 | Estakhri et al. |
| 6,145,051 A | 11/2000 | Estakhri et al. |
| 6,151,247 A | 11/2000 | Estakhri et al. |
| 6,173,362 B1 | 1/2001 | Yoda |
| 6,181,118 B1 | 1/2001 | Meehan et al. |
| 6,182,162 B1 | 1/2001 | Estakhri et al. |
| 6,202,138 B1 | 3/2001 | Estakhri et al. |
| 6,223,308 B1 | 4/2001 | Estakhri et al. |
| 6,226,708 B1 | 5/2001 | McGoldrick et al. |
| 6,230,234 B1 | 5/2001 | Estakhri et al. |
| 6,262,918 B1 | 7/2001 | Estakhri et al. |
| 6,272,610 B1 | 8/2001 | Katayama et al. |
| 6,279,069 B1 | 8/2001 | Robinson et al. |
| 6,279,114 B1 | 8/2001 | Toombs et al. |
| 6,374,337 B1 | 4/2002 | Estakhri |
| 6,393,513 B1 | 5/2002 | Estakhri et al. |
| 6,397,314 B1 | 5/2002 | Estakhri et al. |
| 6,411,546 B1 | 6/2002 | Estakhri et al. |
| 6,795,917 B1 * | 9/2004 | Ylonen ...................... 713/160 |
| 2003/0033471 A1 | 2/2003 | Lin et al. |

FOREIGN PATENT DOCUMENTS

| | | |
|---|---|---|
| EP | 0 489 204 A1 | 6/1992 |
| EP | 0 522 780 B1 | 1/1993 |
| EP | 0 522 780 A2 | 1/1993 |
| EP | 0 544 252 A2 | 6/1993 |
| EP | 0 613 151 A2 | 8/1994 |
| EP | 0 617 363 A2 | 9/1994 |
| EP | 0 619 541 A2 | 10/1994 |
| EP | 0 663 636 A1 | 7/1995 |
| EP | 0 686 976 A2 | 12/1995 |
| FR | 93 01908 | 8/1993 |
| GB | 2 251 323 | 7/1992 |
| GB | 2 291 990 | 2/1996 |
| GB | 2 304 428 | 3/1997 |
| GB | 2 321 728 A | 8/1998 |
| JP | 3-228377 | 10/1981 |
| JP | 59-45695 A | 9/1982 |
| JP | 58-215794 A | 12/1983 |
| JP | 58-215795 A | 12/1983 |
| JP | 59-92483 | 5/1984 |
| JP | 59-162695 A | 9/1984 |
| JP | 60-212900 | 10/1985 |
| JP | 61-96598 A | 5/1986 |
| JP | 62-283497 A | 2/1987 |
| JP | 62-283496 A | 12/1987 |
| JP | 63-183700 A | 7/1988 |
| JP | 1-138694 | 5/1989 |
| JP | 4-57295 | 2/1992 |
| JP | 4-254994 | 9/1992 |
| JP | 4-268284 | 9/1992 |
| JP | 4-278297 | 10/1992 |
| JP | 4-332999 A | 11/1992 |
| JP | 5-128877 | 5/1993 |
| JP | 5-282883 | 10/1993 |
| JP | 6-4399 | 1/1994 |
| JP | 6-36578 | 2/1994 |
| JP | 6-124175 | 5/1994 |
| JP | 6-124231 | 5/1994 |
| JP | 6-131889 | 5/1994 |
| JP | 6-132747 | 5/1994 |
| JP | 6-149395 | 5/1994 |
| JP | 6-266596 | 9/1994 |
| JP | 7-84871 | 3/1995 |
| JP | 7-93499 | 4/1995 |
| JP | 7-114499 | 5/1995 |
| JP | 7-141258 | 6/1995 |
| JP | 7-235193 | 9/1995 |
| JP | 7-311708 | 11/1995 |
| JP | 7-334996 | 12/1995 |
| JP | 8-18018 | 1/1996 |
| JP | RM-37697 | 2/1996 |
| JP | 8-69696 | 3/1996 |
| JP | 9-147581 | 6/1997 |
| JP | 11045212 | 2/1999 |
| SU | 1388877 A1 | 4/1988 |
| SU | 1408439 A1 | 7/1988 |
| SU | 1515164 A1 | 10/1989 |
| SU | 1541619 A1 | 2/1990 |
| SU | 1573458 A2 | 6/1990 |
| SU | 1686449 A2 | 10/1991 |
| WO | 84/00628 | 2/1984 |
| WO | WO 94/20906 | 9/1994 |

OTHER PUBLICATIONS

Sape J. Mullender and Andrew S. Tanenbaum, A Distributed File Service Based on Optimistic Concurrency Control, article, 1985, 12 pgs, ACM.

Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers, 2 pgs.

Hiroshi Nakamura, Junichi Miyamoto, Kenichi Imamiya, Yoshihisa Iwata, Yoshihisa Sugiura and Hideko Oodaira, A Novel Sensing Scheme with On–Chip Page Copy for Flexible Voltage NAND Flash Memories, article, Jun. 1996, 9 pgs., vol. E79–C, No. 6.

Takaaki Nozaki, Toshiaki Tanaka, Yoshiro Kijiya, Eita Kinoshita, Tatsuo Tsuchiya Tsuchiya and Yutaka Hayashi, A 1–Mb EEPROM with MONOS Memory Cell for Semiconductor Disk Application, article, 1991, 5 pgs., Journal Of Solid–State Circuits, vol., 26, No. 4.

Kai Hwang and Faye A. Briggs, Computer Architecture and Parallel Processing, book, 1984, McGraw–Hill, Inc., 2 pgs., US.

Walter Lahti and Dean McCarron, State of the Art: Magnetic VS. Optical Store Data in a Flash, article, 1990, 7 pgs., vol. 15, No. 12, McGraw–Hill, Inc, US.

Ron Wilson, Integrated Circuits; 1–Mbit flash memories seek their role in system design, article, Mar. 1, 1989, 2 pgs., No. 6, Tulsa, OK.

S. Mehroura, J.H. Yuan, R.A. Cemea, W.Y. Chien, D.C. Guteman, G. Samachisa, R.D. Noman, M. Mofidi, W.Lee, Y. Fong, A. Mihnea, E. Hann, R.W. Gregor, E.P. Eberhardt, J.R. Radosevich, K.R. Stiles, R.A. Kohler, C.W. Leung, and T.J. Mulrooney, Serial 9Mb F EEPROM for Solid State Disk Applications, symposium, 1992, 2 pgs., Mountain View, CA.

Steven H. Leibson, Nonvolatile, In–circuit–reprogrammable memories, article, Jan. 3, 1991, 12 pgs., EDN, Circle No. 12.

Walter Lahti and Dean McCarron, State of Art: Magnetic VS. Optical Store Data in a Flash, article, 1990, 7 pgs., vol. 15, No. 12, McGraw–Hill, Inc., US.

Kai Hwang and Faye A. Briggs, Computer Architecture and Parallel Processing, book, 1984, McGraw–Hill, Inc., 2 pgs., US.

Steven H. Leibson, Nonvolatile, in–circuit–reprogrammable memories, article, Jan. 3, 1991, 12 pgs., EDN, Circle No. 12.

Ramon Caceres, Fred Douglis, Kai Li and Brian Marsh, Operating System Implications of Solid–State Mobile Computers, article, 7 pgs., Oct. 1993, Workshop on Workstation Operating Systems.

Michael Wu and Wily Zwaenepoel, A Non–Volatile, Main Memory Storage System, 12 pgs., 1994, ACM, San Jose, CA USA.

Dave Bursky, Innovative flash memories match DRAM densities: available with a choice of features, flash memories are finding homes in many systems (includes related articles on the origins of flash, and on the differences between NAND and NOR flash memories), article, May 16, 1994, 9 pgs., Electronic Design, v. 42, n. 10, The Gale Group.

Anthony Cataldo, New flash enhancements up ante. (Intel's 28F400BV–120 and 28F004BV–120, Almel's AT29BV010 and AT29BV020, and Samsung Semiconductor's KM29V32000 "flash memory "devices)(Product Announcement), article, Mar. 13, 1995, 4 pgs., Electronic News, v.41, n.2058, The Gale Group.

Sam Weber, "Flash" modules' portability, reusability, small size valued for a host of APP9–Consumer formals flocking to "flash", article, Jul. 22, 1996, 9 pgs., Electronic Engineering Times, n.911, CMP Media.

Toshiba, MOS Memory (Non–Volatile), 1995, Data Book.

Stan Baker, But Integration Calls For Hardware, Software Changes: Flash: designers face the down of a new memory age, article, Sep. 12, 2003, 5 pgs., Electronic Engineer Times, 1990, N.619, 41, CMP Media.

Toshiba, Toshiba MOS Digital Integrated Circuit Silicon Gate CMOS, (TC58NS512DC) Mar. 21, 2001, 43 pgs., Data Book.

Toshiba Corporation, SMIL (Smartmedia Interface Library) Hardware Edition Version 1.00, Jul. 1, 2000, 36 pgs, Data Book.

Toshiba, Toshiba MOS Digital Integrated Circuit Silicon Gate, (TC58512FT), Mar. 5, 2001, 43 pgs., Data Book.

Toshiba, Toshiba MOS Digital Integrated Circuit Silicon Gate, (TC58DVM92A1FT00), Jan. 10, 2003, 44 pgs., Data Book.

Toshiba, Toshiba MOS Digital Integrated Circuit Silicon Gate, (TC58DVG02A1FT00), Jan. 10, 2003, 44 pgs., Data Book.

Toshiba, Toshiba MOS Digital Integrated Circuit Silicon Gate, (TH58100FT), Mar. 5, 2001, 43 pgs., Data Book.

35Nonvolatile Memory Technology Review, A Time of Change, Proceedings 1993 Conference, Jun. 22–24, 1993, Linthicum Heights, MD USA.

Toshiba Corporation, SMIL (Smartmedia Interface Library) Software Edition Version 1.00, Jul. 1, 2000, 136 pgs., Data Book.

Toshiba, MOS Memory (Non–Volatile), 1996, 279 pgs., Data Book.

Dan Auclair, Optimal Solid State Disk Architecture For Portable Computers, symposium, Jul. 9, 1991, 7 pgs., SunDisk Corporation.

Book—*Computer Architecture and Parallel Processing,* Kai Hwang & Faye A. Briggs, McGraw–Hill Book Co., ©1984, p. 64.

Magazine—"State of the Art: Magnetic VS. Optical Store Data in a Flash", by Walter Lahti and Dean McCarron, Byte magazine dated—Nov. 1, 1990, 311, vol. 15, No. 12.

Magazine—Technology Updates, Integrated Cirrcuits, "1–Mbit flash memories seek their role in system design", Ron Wilson, Senior Editor, Computer Design magazine 28 (1989) Mar. 1, No. 5, Tulsa OK, US, pp. 30 and 32.

1992 Symposium of VLSI Circuits Digest of Technical Papers, "EEPROM for Solid State Disk Applications", S. Mehoura et al., SunDisk Corporation, Santa Clara, CA. R.W. Gregor et al., AT&T Bell Laboratories. Allentown, PA. pp. 24 and 25.

* cited by examiner

DATA HANDLING SYSTEM

BACKGROUND OF THE INVENTION

CROSS REFERENCE TO RELATED APPLICATION

This application claims the benefit of the priority date of my earlier filed British Application No. 0123419.4, entitled "Data Handling System", filed on Sep. 28, 2001.

1. Field of the Invention

This invention relates generally to electronic data handling system utilizing flash memory for data storage and particularly to providing improved security of the information data stored in flash memory.

2. Description of the Prior Art

In electronic data handling systems, utilizing flash memory data is typically transferred to and from the flash memory in blocks of 528 bytes, which together form one sector or page. In some known system, each sector is composed of 512 bytes of information data (which can either be provided by a host and represents user data, or can be provided by a controller, for example, representing a cyclic storage algorithm data structure), a further 4 bytes of overhead data (which typically is provided by the controller and represents index or header data pertinent to the associated 512 bytes of information data), and a further 12 bytes of data which provide an error correction code for the associated 517 bytes of data.

Accordingly, each sector is partitioned into at least a user data portion and an overhead portion and consequently, by inspection of the flash memory, it is fairly straightforward by reverse engineering to identify the whole of the information data from the succession of 512 bytes provided by the succession of sectors stores in the flash memory. Security of the information data is therefore dependent upon security of the flash memory itself. Thus, the need arises to provide improved security of the information data stored in flash memory.

SUMMARY OF THE INVENTION

It is an object of the present invention to provide improved security of the information data stored in flash memory.

This object is achieved by manipulating the 516 bytes of information and overhead data prior to storage in flash memory such that each stored byte is a reversible function of both information data and overhead data as a result of a data hiding process.

By virtue of the present invention security of the information data is enhanced because the bytes stored in a flash memory sector are no longer partitioned, and each byte is no longer identifiable as being an information data byte or an overhead data byte.

The present invention in a first aspect comprises a method of handling data which is being written to and stored in flash memory, wherein input data, comprising information data and overhead data, undergoes a reversible transformation before being written to flash memory whereupon each bit stored in flash memory, as flash data, is a function of both information data and header data.

Conveniently the input data comprises 512 bytes of information data and 4 bytes of overhead data.

Preferably the reversible transformation of input data which results in the flash data is an XOR function combining bytes of information data and overhead data. For example, 4 bytes of overhead data may be XORd with each of the succession of 128 4 byte sequences which from the 512 bytes of information data to provide 512 bytes of flash data whilst these 512 bytes of flash data are used to generate a 4 byte ECC function which is XORd with the 4 bytes of overhead data to produce a further 4 bytes of flash data.

Preferably the data handling process also produces 12 bytes of error detection and correction capability (ECC) for storage in the flash memory.

Conveniently the ECC is a function of said flash data.

Conveniently the transformation is implemented by an encoder.

Conveniently the method of writing and storing data in flash memory comprises input data being written first to a buffer memory without modification, the input data then being written from the buffer memory, via an encoder to the flash memory.

Preferably the encoder comprises a plurality of XOR gates.

In a second aspect the invention comprises a method of reading encoded data from the flash memory, wherein the encoded data undergoes a reverse transformation which returns the input data to information data and overhead data format.

Preferably the decoder comprises a plurality of XOR gates.

The foregoing and other objects, features and advantages of the present invention will be apparent from the following detailed description of the preferred embodiments which make reference to several figures of the drawing.

IN THE DRAWINGS

DETAILED DESCRIPTION OF THE PREFERRED EMBODIMENTS

Figure 1:
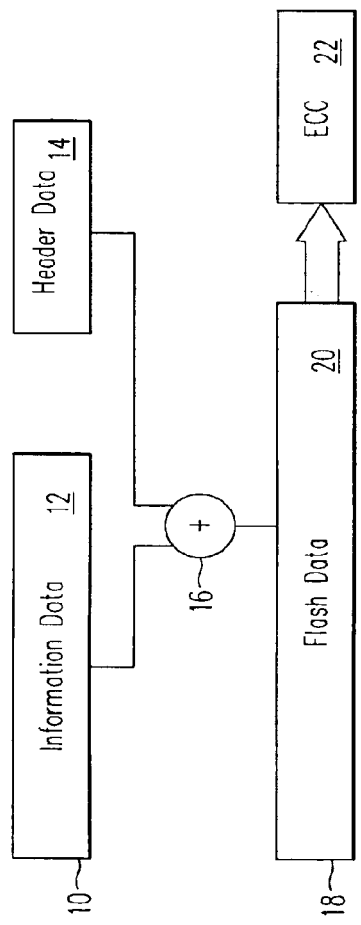
FIG. 1 show s a schematic representation of the method of handling input data according to a first embodiment of the present invention.

With reference to FIG. 1, a first embodiment of the data handling system is shown. In this basic arrangement input data 10 comprises two portions, namely 512 bytes of information data 12 and 4 bytes of header data 14. A first sequence of 4 bytes of information data 12 and the 4 bytes of header data 14 are read, at the same time, from the input data and these 8 bytes of data are transferred to XOR gate 16 whereupon they are transformed by the XOR function to a modified 4 byte data set before being written to the flash memory 18. This process is repeated until all possible 512 bytes of transformed input data have been written to the flash memory 18. The 4 bytes of header data then undergo the XOR transformation with 4 bytes of control hiding key, which are 4 bytes from the incomplete ECC result generated from the 512 bytes of transformed information data, to provide the remaining 4 bytes of flash data. The XOR transformation means that each of the 516 bytes of flash data 20 is a function of information data 12 and header data 14. From the 516 bytes of flash data, 12 bytes of error correction code (ECC) 22 are produced which provides an error detection and correction capability. These 12 ECC bytes 22 are also a function of both information data and header data. This process can be reversed because the XOR function is reversible to enable the reading of transformed data stored in the flash memory.

Figure 2:
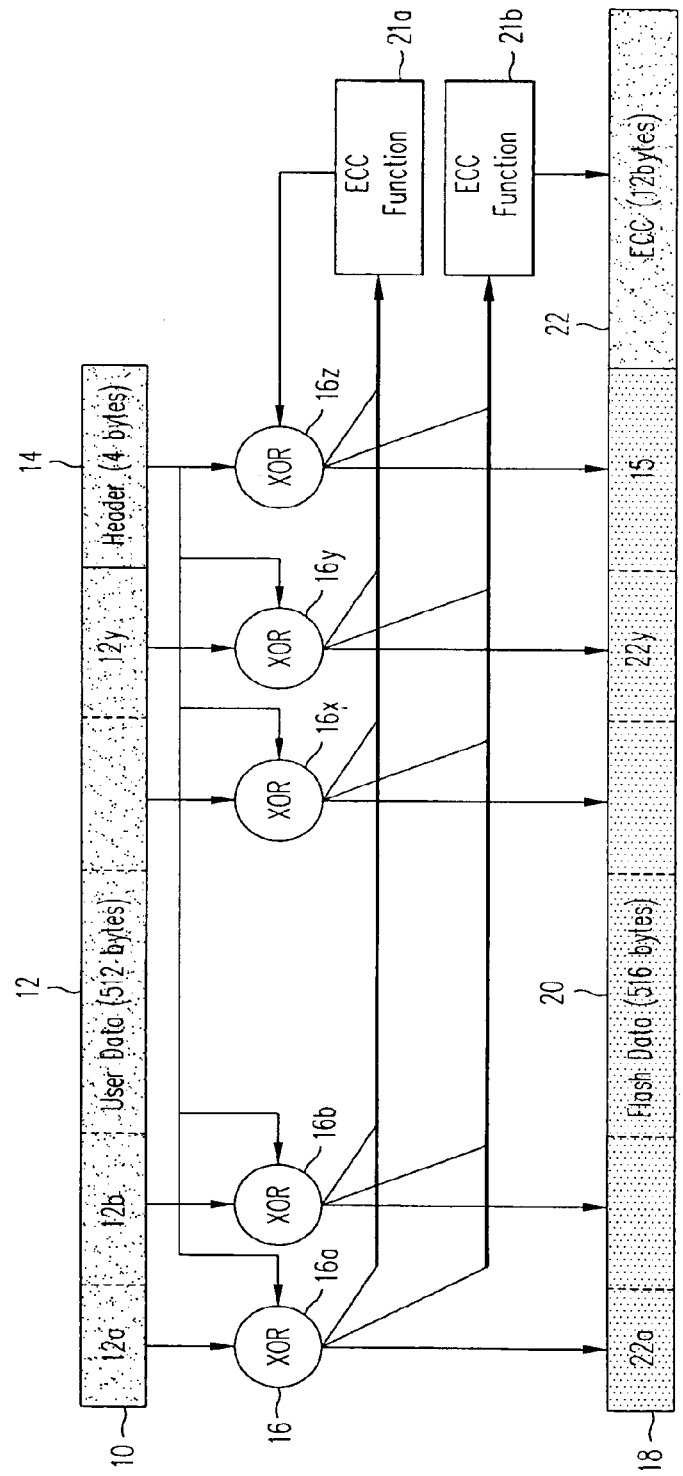
FIG. 2 shows a schematic diagram of the data handling including ECC generation.

In FIG. 2 a second embodiment of the data handling process is shown giving a more detailed overview of the handling process and illustrating the generation of the ECC function more clearly. A first 4 byte word of information data, in this case user data 12*a* supplied by the host, undergoes an XOR operation 16*a* with the 4 bytes of header data 14 to form the 4 bytes of data 22*a* to be written in the corresponding location of the flash memory 18. This is repeated for each other 4 byte word of user data 12. A 4 byte ECC word, generated by an ECC function 21*a* from the first 512 bytes of data which are output from XOR gates 16*a* to 16*y* and transferred to the flash memory 18, undergoes an XOR operation with the 4 bytes of header data 14 to form the 4 bytes of data 15 to be written in the position in the flash memory 18 corresponding to the header data 14. This means the 4 byte ECC word is a function of all 512 bytes of information data. 12 bytes of ECC 22 are also generated by ECC function 21*b* from the modified 512 bytes of user data output from XOR gates 16*a* to 16*y* plus the 4 bytes of user data output from XOR gates 16*a* to 16*y* plus the 4 bytes of header dada output from XOR gate 16*z* and are appended to the 516 bytes of generated data to complete the 528 byte page or sector which is stored in flash memory 18. As can be seen in FIG. 2, the transformation which is implemented in the data handling process maintains the data address sequence of the input data when writing to flash memory, thus information byte 12*a* is transformed by XOR transformation 16*a* and is written to the flash memory 20 as transformed data byte 22*a*, the subsequent information data byte 12*b* is written to the flash memory as transformed data byte 22*b*, and so on for data bytes c, d, etc. After the final information data byte 12*y* has been transformed and written to the flash memory data address 22*y*, the header data 14, when transformed by XOR transformation 16*z*, is written to the flash memory data address 15 corresponding to the end of the transformed information data array. The data address sequence is thus maintained during the data handling process. This is also true of when the process is operated in the reverse decoding process.

The algorithms involved in the handling process carried out by the encoder/decoder will now be described using the following notation and symbols. The 512 byte information data array is represented as D [ ]. The 4 byte header data array is represented as C [ ]. The flash data is a 516 byte array in flash memory denoted by F [ ]. c, k and j are integer constants chosen from the ranges $0 \leq c > 3$, $0 \leq k \leq 511$, and $0 \leq j \leq 11$. ! is a one byte data hiding key generated by q(C), which is the data hiding key generation function, from header data C[ ] with $$Q=q(C) \quad (1)$$

where, for example $q(C)=C[c]$ (2)

P is a one byte header hiding key generated by a header hiding key generating function p( ) by $$P=p(F[0,511]) \quad (3)$$

where, for example $p(F[0,511])=rotate(F[k])$ (4)

The error correction code ECC generation function is represented as ecc( ) and is an algorithm such as Reed Solomon encoding, $\oplus$ is a bytewise XOR function and rotate( ) is a bitwise byte rotation function.

The encoding of the input data to give flash data is described by the following for the $x^{th}$ byte of the array.

$$F[x]=D[x] \oplus Q \text{ where } 0 \leq x \leq 511 \quad (5)$$

$$F[x]=C[x-512] \oplus P \text{ for } 512 \leq x \leq 515 \quad (6)$$

and $F[x]=ecc(F[0,515])$ for $516 \leq x \leq 527$ (7)

These result in all bits in flash data being a function of both information data and header data, and the error correction code is a function of flash data.

The encoding process of the input data is as follows, the data hiding key Q is firstly generated by equation (1), using the key generation function of equation (2). Next equation (5) is used to generate part of the flash data page F[0, 511] by performing a bytewise XOR of the data hiding key Q with information data D[ ]. As Q is a function of header data C[ ], the flash data F[0, 511] is a function of both information data D[ ] and header data C[ ]. The header hiding key P is generated by equation (3) from the flash data calculated by equation (4). The next part of the flash data F[512, 515] is generated by performing a bytewise XOR of header hiding key P with header data C[ ]. As P is a function of flash data F[0, 511] which is in turn a function of both information data D[ ] and header data C[ ], then F[512, 515] is a function of both information D[ ] and header data C[ ]. Finally the error correction code ECC is added to the flash page as F[516, 527] calculated by equation (7). The ECC is a function of F[0, 515] which has been shown above to be a function of both information data D[ ] and header data C[ ]. Thus the whole of the flash page is a function of both information data D[ ] and header data C[ ] and therefore the information data and control data cannot be readily distinguished.

The decoding of flash data follows the reverse of the above transformation processes to return from the flash data F[ ] to the format of separate information data D[ ] and header data C[ ] and uses the equations $$C[x-512]=F[x] \oplus P \text{ for } 512 \leq x \leq 515 \quad (8)$$

and $$D[x]=F[x] \oplus Q \text{ for } 0 \leq x \leq 511 \quad (9)$$

The first state of the decoding process is to check that the ECC is valid. ECC checking ensures that equation (7) holds true for the flash data read from the flash memory. If this is not true then the error correction algorithm is applied to correct the flash data array so that equation (7) does hold true.

After checking for errors, equation (3) is applied to calculate control hiding key P. The header data C[ ] can be restored using equation (8) which is a re-arrangement of equation (6). The data hiding key Q can then be calculated using equation (1). Q can then be used to restore the information data-D[ ] by applying equation (9), which is a re-arrangement of equation (5).

Figure 3:
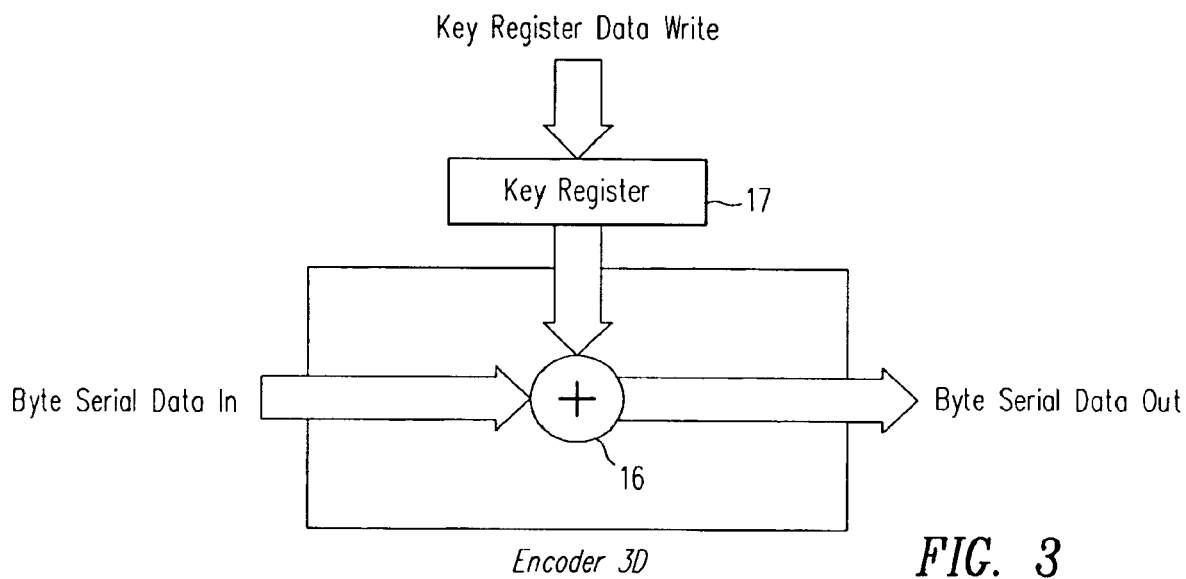
FIG. 3 shows a schematic diagram of the circuit arrangement which implements the data handling.

In practice the implementation of the data manipulation process in the encoder/decoder is split into two parts. The calculation of the key generation functions Q and P is performed in firmware executing within the microprocessor. The calculation of the flash data is performed by hardware as the alteration of large volumes of data involved in the calculations would be overly intensive for firmware. A schematic diagram of one embodiment of the circuit which could implement the encoding or decoding processes of equations (5), (6), (8) and (9) is shown in FIG. 3. For the purposes of clarity FIG. 3 will be described referring to an encoder but it should be understood that the corresponding process of decoding may be carried out by the same arrangement.

Firstly a value representing the data hiding key P is written to the key register 17 from the firmware which is typically a controller comprising an SRAM and microprocessor. The microprocessor then triggers the transfer of data through the hardware, i.e. the encoder. User data and header data is fed from the controller SRAM through the encoder 30 in 32 bit word serial fashion which is then converted to byte serial data which is XORd, by XOR gate 16, with the appropriate key, that is the data hiding key P and the control hiding key Q respectively, and is then passed to the byte serial data output. The microprocessor of the controller determines which of the appropriate keys of P and Q should be implemented by the key register 17 depending on the data being transferred. The byte serial data output is then, typically, fed into the ECC generation circuitry. This encoder/decoder 30 can be inserted as a decoder into any serial byte stream through which the flash data is written or as an encoder, into any serial byte stream through which the flash data is read. The encoder/decoder an also be integrated with other memory elements with the encoder/decoder being placed on the input or output data ports from a memory.

There are numerous possible configurations for encoding/decoding on reading/writing data from both single port and dual port memories.

Figure 4:
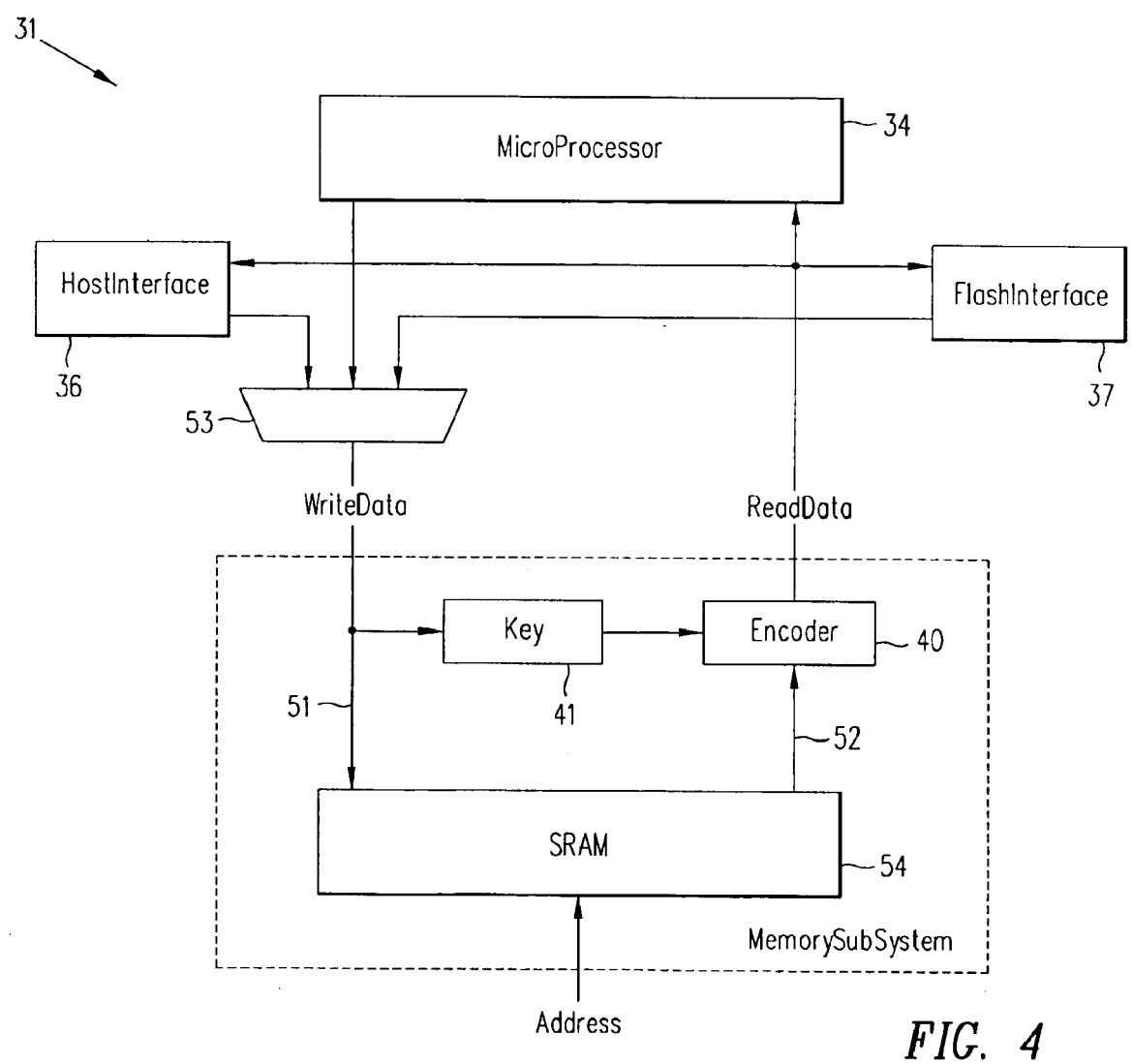
FIG. 4 shows a memory system with a single port controller SRAM memory having an associated encoder and decoder.

In one embodiment, shown in FIG. 4, there is shown a controller 32 for use in a memory system, the controller 32 comprising a host interface 36, a flash memory interface 37, an SRAM memory 54 and a microprocessor 34. An encoder 40, having key register 41, is placed on the read port 52 of a single port SRAM memory 54. A multiplexer 53 is placed on the write port 51 of SRAM 54 and is used by control logic within the controller, to select the source of data into the SRAM on each clock cycle from the input options of the host provided via host interface 36, the microprocessor 34 or the flash memory provided via the flash memory interface 37. Due to the arrangement of the memory system and the encoder 40 being arranged to perform a symmetric function on the data, the encoder 40 can also perform a decoding function. If input data is written from host via host interface 36 to the SRAM 54, then as this data is read from the SRAM it is transformed by the encoder 40 having data hiding and control hiding keys provided by key register 41. The transformed data is stored in the flash memory. In the process to return the data to the host, the transformed data is first written from the flash memory via the multiplexer 53 to the SRAM 54. As the data is then written to the host interface 36 it is transformed upon being read from the SRAM 54 by the encoder 40 on read port 52. As the encoder is performing a symmetric function on the data for a second time this results in unencoded data being written to the host.

Figure 5:
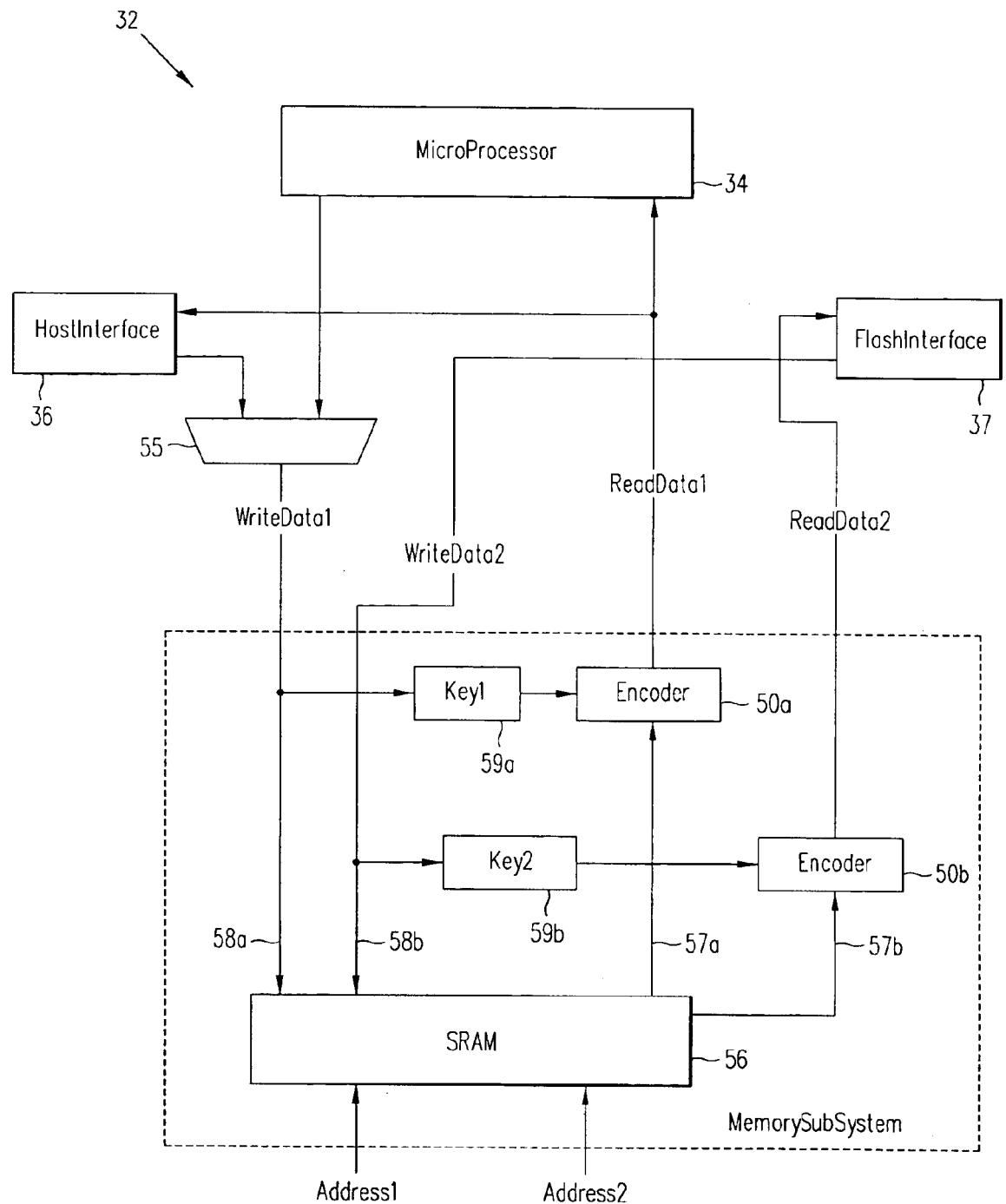
FIG. 5 shows a dual port memory having two encoders.

In a single port memory system such as that of FIG. 4, only one "block," i.e. only one of the host interface, flash interface or microprocessor can access the memory subsystem during one clock cycle, however in some systems it is desirable for the SRAM memories of the controller to have dual ports for reading and writing, so that the SRAM can be simultaneously accessed by two blocks at any one time, for example to allow the microprocessor to read data from the SRAM memory whilst data is simultaneously being transferred to flash. Such a system allows memory operations to occur in parallel. Such a system also provides the facility for each block to have data hidden in different ways within the SRAM 56. An example of such a system is shown in FIG. 5 wherein the dual port SRAM memory 56 of the controller 32 has read data ports 57a and 57b, and write data ports 58a and 58b. Encoders 50a and 50b are placed on read data ports 57a and 57b respectively. Each encoder 50a and 50b has a separate key, these are keys 59a and 59b respectively, to enable each stream of data to be encoded or effectively decoded as appropriate.

In the arrangement shown the microprocessor 34 and host interface 36 share access via multiplexer 55 of write port 58a of the SRAM 56, and share access of read port 57a. The Flash interface has write port 58b and write port 57b of the SRAM dedicated to itself.

Figure 6A:
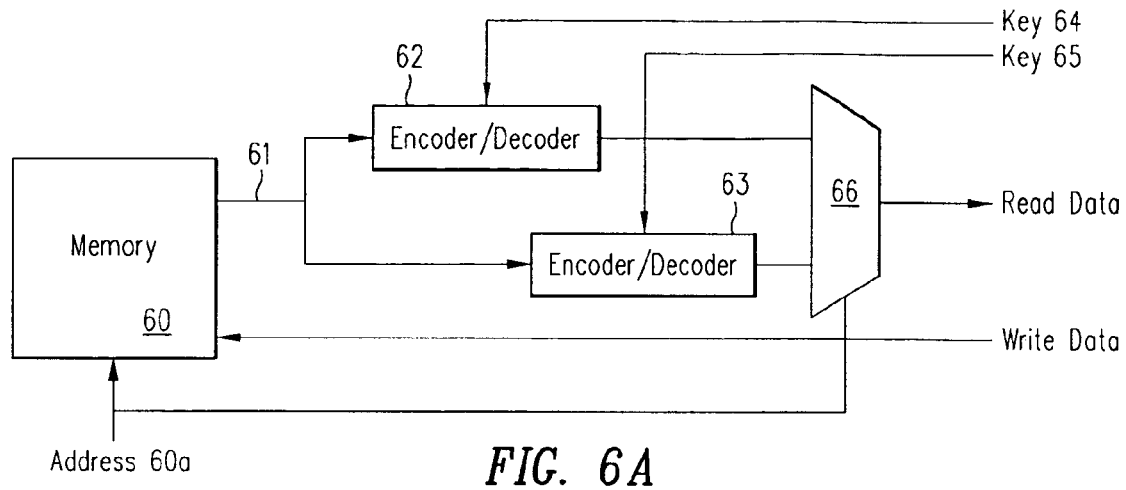
FIG. 6a shows a first single port memory having two encoders.
Figure 6B:
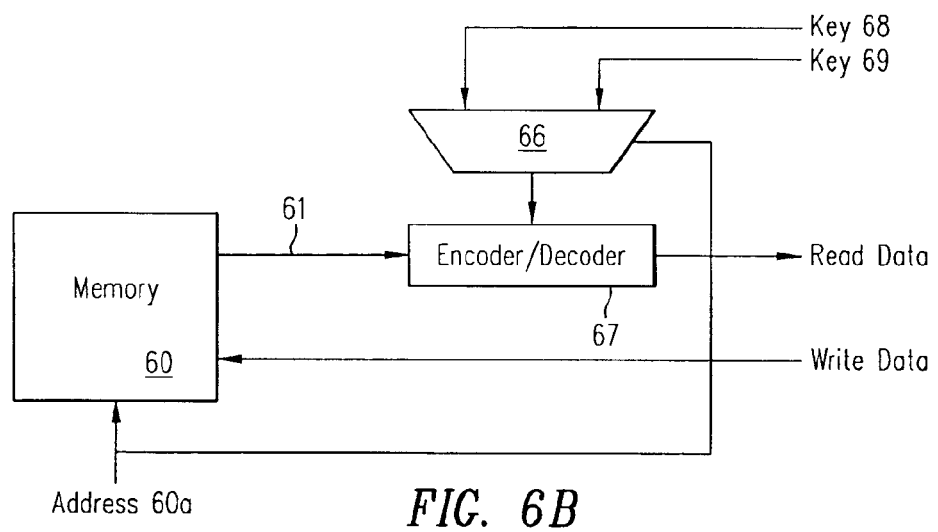
FIG. 6b shows a second single port memory having one encoder.

FIGS. 6a and 6b show alternative configurations of multiple encoders and associated SRAM memory 60 which could be integrated within memory systems in the same manner as illustrated in FIGS. 4 and 5. When the memory 60 is integrated within such a memory system, the order of data being read to and from the SRAM memory 60 is defined by the order of addresses sent to the memory 60 by controlling logic of the controller via address bus 60a. As part of the system, several processes within the processor may be accessing different portions of memory that are being hidden using a different data hiding key.

In FIG. 6a there is shown a single port SRAM memory 60 with encoders 62 and 63, having data hiding keys 64 and 65 respectively, located in parallel on the read data port 61. Some of the bits within the address sent to the SRAM memory 60 determines which of encoders 62 and 63 should be used. Multiplexer 66 is used by the controller to choose between the encoder output to be used.

An alternative arrangement for such a configuration is shown in FIG. 6b, with a single encoder 67 being situated on read data port 61. Two keys, 68 and 69, are provided with multiplexer 66 being arranged between the key buses and the encoder 67. In this arrangement the multiplexer 76 uses some bits within the input address to determine which of the keys 68 and 69 is fed into the decoder 67.

It should be noted that the above are not an exhaustive selection of configurations. Also in any of the above disclosed configurations it should be understood that the encoder/decoder could be placed on the write or output data port of the SRAM memory.

Figure 7:
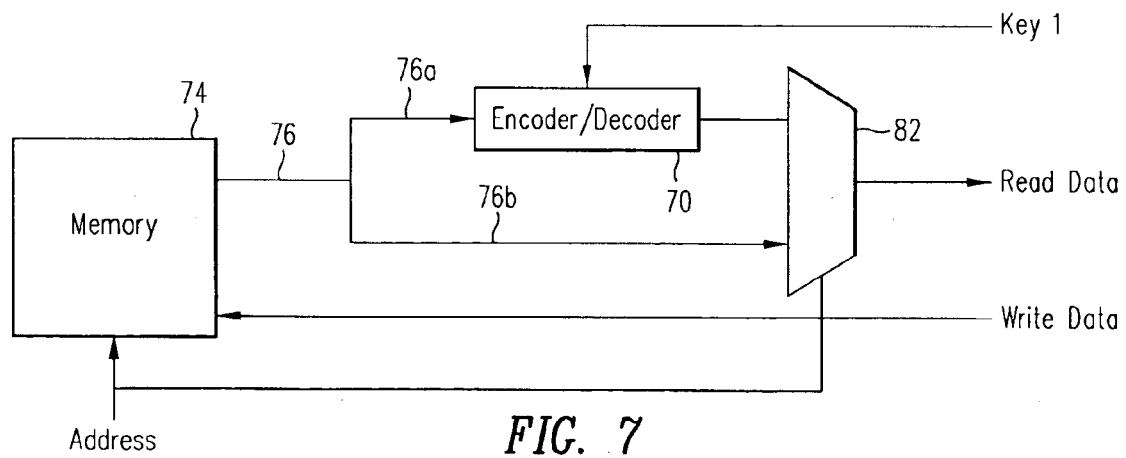
FIG. 7 shows a schematic diagram of the circuit arrangement which implements data manipulation according to a third embodiment of the invention.

Another embodiment of the circuit in which the transformation process may be implemented is shown in FIG. 7. This arrangement is an example of how the data handling process can be implemented in hardware which allows both transformed and untransformed data to be written to the flash memory for storage. Data is read from the SDRAM 74 and transferred along read port 76 which splits into two read data lines 76a and 76b respectively. In this case the address supplied to the memory 74 is used to choose between an output from the memory, which is "hidden" by the facility of Key 1, and an output from the memory which is not encoded or decoded. If the data travels along read data line 76a, it undergoes an XOR transformation implemented by the encoder 70. The transformed data is then read to multiplexer 82 from where it is transferred by bus 86 to the flash memory 18. The transformed data can also be accessed from bus 16 by the host 88 or the microprocessor 84. However, the provision of multiplexer 82 means that the information data may alternatively be written directly to the bus from the SDRAM 74 without transformation upon transfer along read data line 76b.

Various modifications may be made to the invention as hereinafter described without departing from the scope of the invention. For example different symmetrical reversible transformations, such as NXOR (not XOR), or an XOR gate followed by the swapping of data bits may be used instead of the described XOR function, to combine the information data and header data. Alternatively functions which are asymmetric, such as addition modulo-256 could be used, however these would make the transformation more difficult to reverse engineer and thus would require more complex hardware as different keys would be required for both encoding and decoding, however the data flow would remain the same. The transformation may also be implemented on words of any size as the algorithms used are defined on bytes. This means the word could be of a size of 4 bytes for example.

The equation (1) which describes the function for generating the data hiding key, using header data C as a parameter, can be expanded to include other parameters thus making the data hiding key a more complex function. For example, as shown in equation (1b), a security key. K security, provided by the host or generated by, for example, the algorithm, (shown in equation 2b), can be added $$Q=q(C, K\text{security}) \quad (1b)$$

$$q(C)=C[c] \; K\text{security where } 0 \leq c \leq 3 \quad (2b)$$

When implementing these equations the values stored in the flash sector F [0, 511] are changed and, as a result, since the header hiding key P is a function of F [0, 511], the value generated for P will also change.

It is possible for the information data and header data to be of a different size from that used in the examples given. This would have the effect of altering the ranges of functions D[ ], C[ ] and F[ ] as well as the ranges from which the integer constants c, k and j are chosen. Additionally it can be ensured that Q and P never lead to an identity transform, by detecting such values that would lead to an identity transform and substituting a suitable predetermined alternative.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A data handling system for handling data being written to or stored in flash memory comprising:

means for receiving input data including bits forming bytes and bytes being stored in sectors within the flash memory, said input data including information data and overhead data;

means for reversibly transforming the input data, wherein the transforming means is an encoder;

means for writing the transformed input data into the flash memory, wherein the encoder performs an encoding process of the input data by generating a data hiding key Q, performing an XOR operation, on a byte-by-byte basis, of the data hiding key Q with the information data, generating a header hiding key P, performing an XOR operation, on a byte-by-byte basis, of the header hiding key P with the header data; and wherein each bit of the input data that is written into flash memory, as flash data, is a function of both information data and overhead data thereby enhancing security of the information data due to the bytes of the input data stored in the flash memory sector no longer being partitioned, and each byte no longer being identifiable as being an information data byte or an overhead data byte.

2. A data handling system as recited in claim 1 wherein the input data comprises 512 bytes of information data and 4 bytes of overhead data.

3. A data handling system as recited in claim 1 wherein the means for reversibly transforming the input data results in the flash data being an XOR function combining bytes of information data and overhead data.

4. A data handling system as recited in claim 1 further including means for producing 12 bytes of error detection and correction capability (ECC) for storage in the flash memory.

5. A data handling system as recited in claim 4 wherein the ECC is a function of the flash data.

6. A data handling system as recited in claim 1 the encoder comprises a plurality of XOR gates.

7. A data handling system as recited in claim 1 including a buffer memory wherein the input data being written first to a buffer memory without modification, the input data then being transferred from the buffer memory, via the encoder, to the flash memory.

* * * * *